(12) United States Patent
Gross

(10) Patent No.: US 7,180,296 B2
(45) Date of Patent: Feb. 20, 2007

(54) MAGNETIC RESONANCE IMAGING RECEIVE CIRCUIT

(75) Inventor: Patrick Gross, London (GB)

(73) Assignee: Imperial College Innovations Limited, London (GB)

( * ) Notice: Subject to any disclaimer, the term of this patent is extended or adjusted under 35 U.S.C. 154(b) by 0 days.

(21) Appl. No.: 10/511,957

(22) PCT Filed: Apr. 29, 2003

(86) PCT No.: PCT/GB03/01892

§ 371 (c)(1),
(2), (4) Date: Jul. 19, 2005

(87) PCT Pub. No.: WO03/093851

PCT Pub. Date: Nov. 13, 2003

(65) Prior Publication Data

US 2006/0164089 A1    Jul. 27, 2006

(30) Foreign Application Priority Data

Apr. 29, 2002  (GB) ................... 0209756.6

(51) Int. Cl.
    *G01V 3/00*  (2006.01)
(52) U.S. Cl. ...................... 324/322; 324/318
(58) Field of Classification Search ........ 324/300–322; 600/117, 407, 410–424; 330/210
    See application file for complete search history.

(56) References Cited

U.S. PATENT DOCUMENTS

| | | | |
|---|---|---|---|
| 4,633,181 A | 12/1986 | Murphy-Boesch et al. | |
| 4,801,885 A | 1/1989 | Meissner et al. | |
| 4,887,039 A * | 12/1989 | Roemer et al. | ............. 324/322 |
| 4,920,318 A | 4/1990 | Misic et al. | |
| 5,144,244 A | 9/1992 | Kess | |
| 5,450,011 A * | 9/1995 | Boeijen et al. | ............. 324/322 |
| 5,903,150 A * | 5/1999 | Roznitsky | ................ 324/318 |
| 5,964,705 A * | 10/1999 | Truwit et al. | ................ 600/423 |
| 6,263,229 B1 | 7/2001 | Atalar et al. | |
| 6,549,800 B1 * | 4/2003 | Atalar et al. | ................. 600/423 |

(Continued)

FOREIGN PATENT DOCUMENTS

EP    0315 382    5/1989

(Continued)

OTHER PUBLICATIONS

"An Expandable Intravenous RF Coil For Arterial Wall Imaging", A. J. Martin et al., J. Magan. Reson. Imaging, 1998, vol. 8 No. 1 pp. 226-234.

(Continued)

*Primary Examiner*—Brij B. Shrivastav
(74) *Attorney, Agent, or Firm*—Morgan & Finnegan, LLP

(57) ABSTRACT

A magnetic resonance imaging receive circuit, for use e.g. within the body of a patient during an MR imaging procedure, includes a balanced MR coil (50) connected to balanced matching and decoupling circuitry (110, 120). Signal transfer passes along two micro-coaxial cables (52, 54) to signal combination circuitry (300) with common mode rejection. Signals then pass along a further coaxial cable (82), to a receiver. The coil (50) may be incorporated into an endoscope or catheter probe, so providing detailed MR imaging of the treatment area.

12 Claims, 4 Drawing Sheets

U.S. PATENT DOCUMENTS

| | | | |
|---|---|---|---|
| 6,762,561 B1* | 7/2004 | Kawato | 315/39.51 |
| 6,766,185 B2* | 7/2004 | Scott | 600/410 |
| 6,871,086 B2* | 3/2005 | Nevo et al. | 600/424 |
| 6,898,454 B2* | 5/2005 | Atalar et al. | 600/410 |
| 6,930,480 B1* | 8/2005 | Fujita et al. | 324/318 |

FOREIGN PATENT DOCUMENTS

| | | |
|---|---|---|
| GB | 2331587 | 5/1999 |
| WO | WO 00/25673 | 5/2000 |

OTHER PUBLICATIONS

"Coils For Insertion Into The Human Body", Hurst et al., John Wiley & Sons, pp. 1373-1378.

"Intravascular Magnetic Resonance Imaging Using a Loopless Catheter Antenna", Ocali et al., MRM 37: 112-118, 1997.

"Endovascular Coils For Interventional MRI", Gregory C. Hurst, Interventional MRI, Mosby Inc., 1999, pp. 50-54.

"Active Visualization—MR Tracking", C.L. Dumoulin, Interventional Magnetic Resonance Imaging, Springer-Verlag, 1998, pp. 65-75.

"Intravascular (Catheter) NMR Receiver Probe: Preliminary Design Analysis and Application to Canone Iliofemoral Imaging", Hurst et al., Magnetic Resonance In Medicine 24, 1992, pp. 343-357.

"Electronically Tunable Surface-Coil-Type Resonator for L-Band EPR Spectroscopy", Hirata et al., Journal of Magnetic Resonance 142, pp. 159-167, 2000.

"A Disposable Prostate Probe and Interface system For High Field", George J. Misic et al., Book of abstract, Society of Magnetic Resonance in Medicine, 8th Annual Meeting 1989.

"Determination of Appropriate RF Blocking Impedance For MRI Surface Coil and Arrays", Kocharian et al., Magnetic Resonance materials in Physics Biology and Medicine 10 pp. 80-83, 2000.

"Improvements in Electronic Decoupling of Transmitter and Receiver Coils", Picard et al., Journal of Magnetic Resonance, series B, 1995, pp. 110-115.

* cited by examiner

MAGNETIC RESONANCE IMAGING RECEIVE CIRCUIT

The present invention relates to a magnetic resonance imaging (MRI) receive circuit, and in particular although not exclusively to a balanced connection scheme for a small MRI antenna intended for use within the body of a patient. The invention finds particular although not exclusive application within the field of minimally-invasive MRI.

Magnetic resonance imaging for medical diagnosis is well known. Typically, the entire patient or at least that part of the patient to be studied is placed within the coils of an MRI scanner. During a transmit phase, radio-frequency coils within the scanner generate a very strong static magnetic field (e.g. 0.5 Tesla) which causes the hydrogen nuclei within that part of the patient being imaged to align themselves with the field. This primary magnetic field is very homogeneous and very time-constant. This primary magnetic field is then modified by three superimposed gradients, one for each of the x, y and z directions. These vary at audio frequencies, and are typically linear within the volume of interest. The function of the gradients is to provide a spatial modulation of the field which can then be used in signal localisation.

After excitation from the radio frequency transmit coil and under the influence of the magnetic main field, the magnetic moments of the hydrogen nuclei gyrate at a frequency proportional to the local magnetic field strength, and eventually decay back to their equilibrium positions. In order to create an image, one or more radio frequency coils are used as receivers. The transmit coil may also be used for receive, or specialised receive coils may instead be used. The gyration of the moments causes currents to be induced in the coils. By analysing those induced currents, and allowing for the three superimposed gradients, the body parts of interest can be imaged.

In minimally-invasive MRI, a separate, small, receiving coil or antenna is used to receive the signal, instead of or in addition to the radio-frequency coils of the MRI apparatus itself. Such a coil may be placed either adjacent to the patient's skin or may be inserted by means of a probe into a patient's body cavity, for example into the colon.

One such device, which represents the closest prior art known to the applicant, is described in A. J. Martin, R. F. McLoughlin, K. C. Chu, E. A. Barberi and B. K. Rutt: *An Expandable Intravenous RF Coil for Arterial Wall Imaging J. Magn. Reson. Imaging*, 8(1):226–234, 1998. There are, however, a number of problems with this device. In particular, the circuitry is asymmetric with respect to the twisted pair of cables which connects to the antenna, so the system will not operate properly, and could even be dangerous, if in the operating theatre the twisted pair of cables were to be connected the wrong way round. For the same reason, there could be a danger if a large DC voltage were to be present on the line, since that could cause large potential differences to arise in the twisted pair. This is a particular difficulty when antennas are used which look like short circuits at DC (such as the one used by Martin et al).

A number of other approaches are known in which MR coils are inserted into patients, including the following:

Hurst & Misic: *Methods in Biomedical Magnetic Resonance Imaging and Spectroscopy*, chapter Coils for Insertion into the Human Body, pages 1373–1378. John Wiley & Sons, New York, USA, 2000.

Ocali and Atalar: *Intravascular Magnetic Resonance Imaging Using a Loopless Catheter Antenna:* MRM 37:112–118 (1997).

Hurst: *Endovascular Coils for Interventional MRI*, pages 50–54, in *Lufkin: Interventional MRI*, published by Mosby Inc. St Louis, Mo., USA, 1999.

Dumoulin: *Active Visualization—MR Tracking: in Debatin and Adam (Eds) Interventional Magnetic Resonance Imaging*, Springer-Verlag, Berlin, 1998.

Hurst, Hua, Duerk and Cohen, *Intravascular (Catheter) NMR Receiver Probe: Preliminary Design Analysis and application to Canine Iliofemoral Imaging*, Magnetic Resonance in Medicine 24, 343–357 (1992).

Other documents of background relevance to MRI imaging include the following:

Hirata, Walezak and Swartz: *Electronically Tunable Surface-Coil-Type Resonator for L-Band EPR Spectroscopy:* Journal of Magnetic Resonance 142, 159–167 (2000).

Misic et al: *A Disposable Prostate Probe And Interface System for High Field:* Book of Abstracts, Society of Magnetic Resonance in Medicine, $8^{th}$ Annual Meeting, 1989.

Kocharian: *Determination of Appropriate RF Blocking Impedance for MRI Surface Coils and Arrays:* Magnetic Resonance Materials in Physics, Biology and Medicine 10 (2000) 80–83.

US Patent to Kess: U.S. Pat. No. 5,144,244.

US Patent to Murphy-Boesch et al: U.S. Pat. No. 4,633,181.

It is an object of the present invention at least to alleviate the difficulties of the prior art.

According to the present invention there is provided a magnetic resonance imaging receive circuit, comprising:

(a) a first portion including an rf antenna and decoupling circuitry adjacent to the antenna;

(b) a spaced-apart second portion including mode control circuitry for causing the decoupling circuitry to switch the circuit between an rf receive mode in which the antenna is tuned for receipt of an rf signal, and a decoupled mode in which end terminals of the antenna are held at a substantially equal DC bias potential; and (c) balanced cables connecting the first and second portions, the cables transmitting a DC control to the decoupling circuitry when the circuit is in decoupled mode, and transmitting differential rf signals to the second portion when the circuit is in receive mode.

A circuit of this type has a number of specific advantages over prior art circuits such as that shown in Martin et al. In particular, in circuits embodying the present invention, there is no problem with swapping over of the cables, there is no problem with antennas which look like short circuits at DC, and there is the ability (if desired) to de-couple e.g. to ground even without having a capacitor in series with the antenna. In terms of safety, there is less danger when a large DC voltage is present on the line. In particular, the antenna and any matching circuit (not including the decoupling circuitry) experiences only one voltage. Also, if twin-axial cable or shielded twisted pair is used, the two central conductors will not in that case experience large potential differences.

Preferably, the first portion includes matching circuitry which provides substantially complete impedance matching between the antenna and the cables. That provides the additional advantage that the cable-length becomes substantially immaterial. In Martin et al, the length of the balanced cables is critical, since the decoupling impedance would otherwise vary in an unknown way. For a 0.5 Tesla field, the cable length has to be 3.5 metres. This may be inconveniently long in the operating theatre, forcing the surgeon to tie the cable up in some way before starting work. Miniature coaxial cable often used in minimally invasive applications is substantially lossy and prone to interference; its length should therefore be minimised. Also, the required cable length for the Martin et al system reduces as the magnetic field strength increases, making the required length inconveniently or even impossibly short for, say, a 1.5 Tesla field. If the rf antenna is fully matched proximal to the antenna, the cable length becomes largely in material.

Preferably decoupling is performed by using the potential difference between equal DC biases on both signal lines and a grounded shield to substantially ground specific points of the antenna (for example, using diodes, where the antenna is electrically connected to ground only via the scanner's receiver impedance during receive mode).

Preferably, the first portion may be attached to or be incorporated within an endoscope or catheter probe, for insertion into the body cavity of a patient. Alternatively, the first portion may be attached to, or form part of, a surface coil.

The first portion may be modular, and may be designed to plug into balanced cables of any desired length. The far end of the cables may, themselves, be plugged into a modular second portion. The modular first portion and/or the cables may be designed for single use, with the second portion (e.g. including a balun) designed for re-use.

The invention extends to a magnetic resonance imaging device including a circuit as previously defined.

The invention may be carried into practice in a number of ways and one specific embodiment will now by described, by way of example, with reference to the accompanying drawings, in which.

Figure 1:
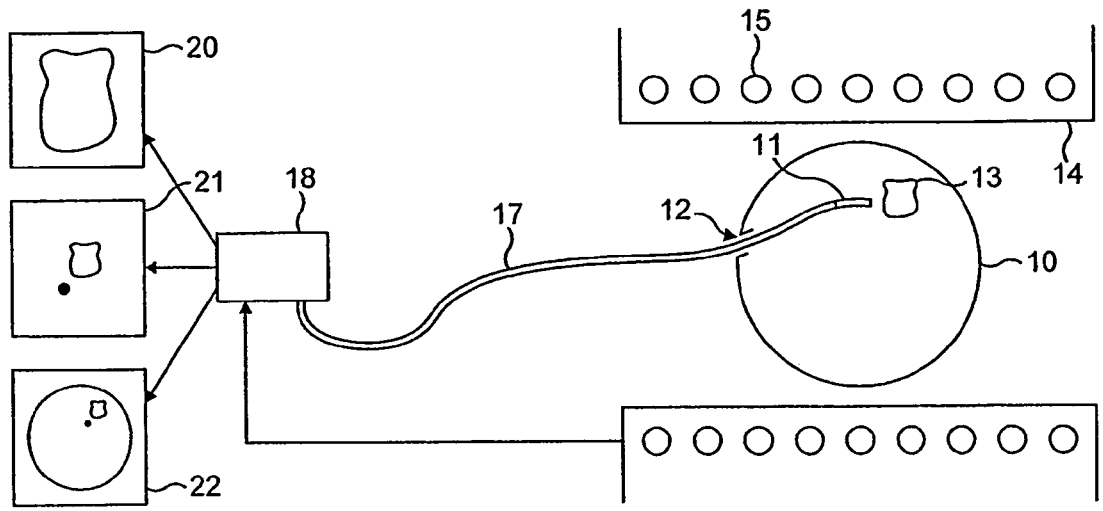
FIG. 1 shows, very schematically, the surgical context within which the preferred circuit of the present invention may be used.

FIG. 1 shows, schematically, a typical surgical context within which the preferred circuit of the present invention may be used. The patient 10 who is undergoing minimally-invasive surgery or treatment, has an endoscope probe 11 inserted into a body cavity (for example the colon) through a natural opening or a small wound 12 made in the skin. The endoscope is moved within the patient until it reaches an area 13 of interest.

Surrounding the patient is an MRI scanner 14 having transmit/receive coils 15. In a transmit mode these expose the patient to a radio frequency field, exciting the nuclear spins and thereby realigning their magnetic moments away from the equilibrium position. In a receive mode, they detect RF signals back from the patient's tissues. Control circuitry, and circuitry for producing gradients (not shown) are also provided.

Figure 5:
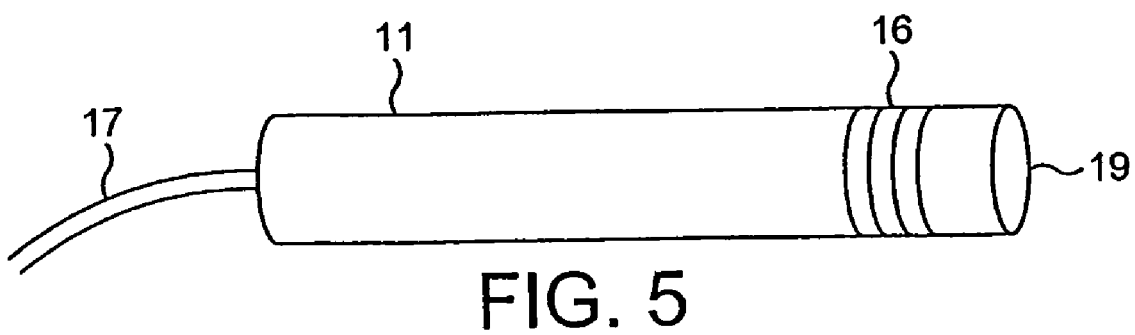
FIG. 5 shows, schematically, the antenna in conjunction with an endoscope probe.

As best seen in FIG. 5, the endoscope probe 11 has, associated with it, a small receive antenna 16, typically of about 1 cm in diameter. Extending from the probe 11 is a line 17 which carries both coaxial cables for controlling and receiving signals from the antenna 16, and also an optical fibre which transmits light to and receive images back from, imaging optics 19 on the probe. An detector/imaging unit 18 receives signals from the optics 19, the antenna 16 and the transmit/receive coils 15, and displays either separate or superimposed respective images 20,21,22. The position of the probe, within the field of the receive coils 15, may be tracked by means of a water-filled coil (not shown) formed within the probe.

Figure 2A:
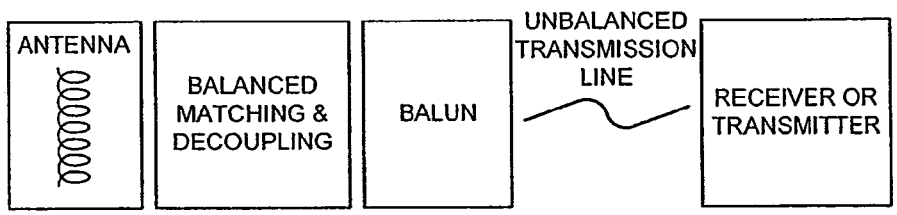
FIG. 2A shows a typical prior art receive circuit.

Some method must be provided to decouple the receive antenna during the transmit portion of the imaging cycle. This is needed both to protect the receiver from large currents directly induced in the receive coil, and also to avoid such currents distorting the homogeneous field that is created by the transmit coil 15. One conventional method of achieving this is with the arrangement shown in FIG. 2A, using a single length of unbalanced coaxial cable as the transmission line. There are a number of problems with such an arrangement, including the need for the inductive elements to be placed at a sufficient distance from the antenna not to induce local magnetic field disturbance.

Figure 2B:
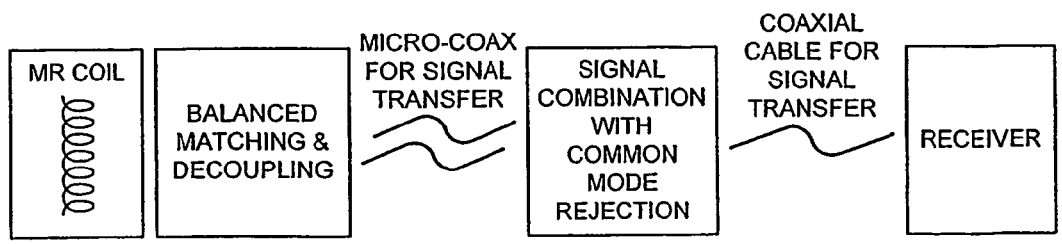
FIG. 2B shows, in functional form, the arrangement of an embodiment of the present invention.

FIG. 2B shows, in functional form, the arrangement of an embodiment of the invention.

Figure 4:
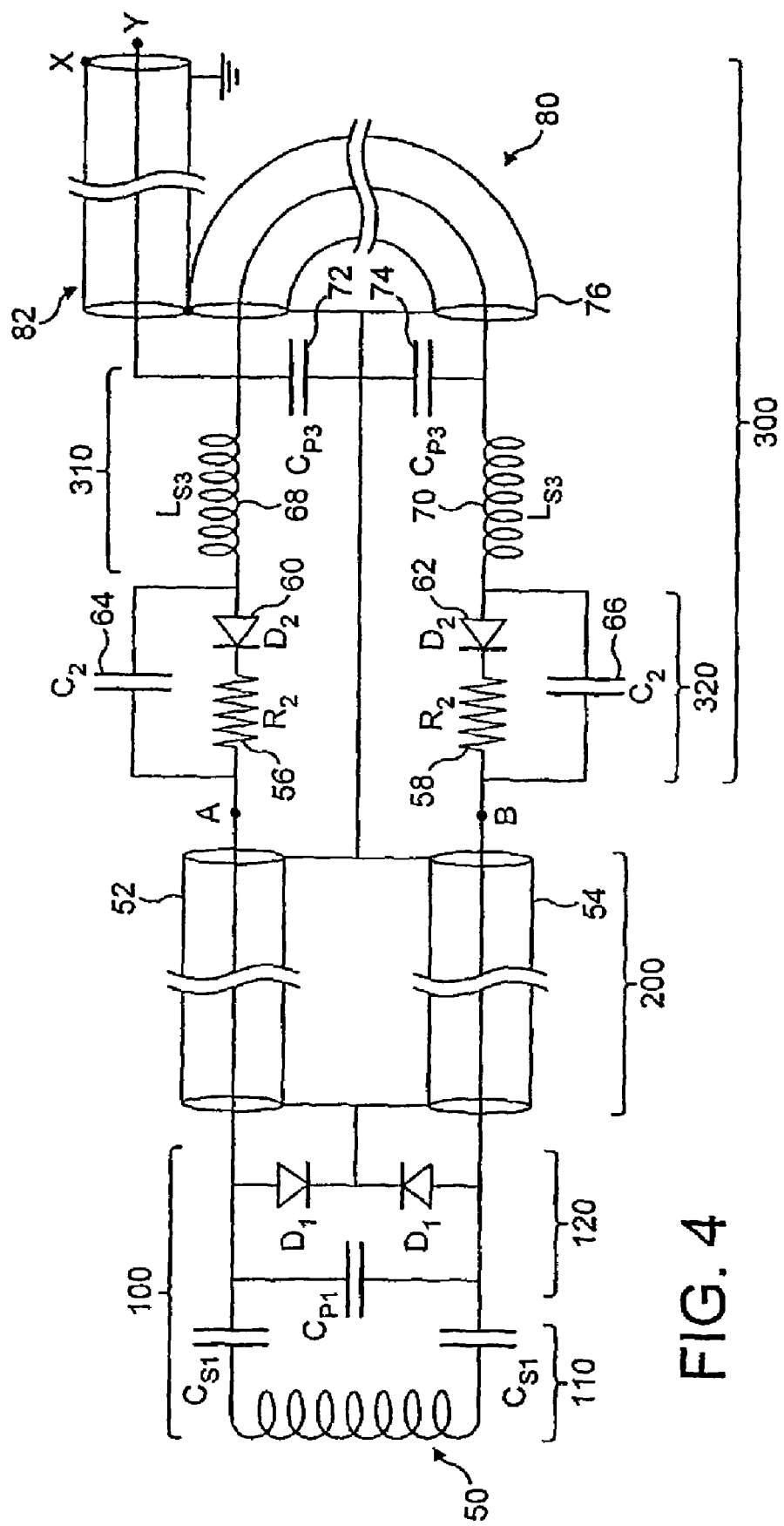
FIG. 4 shows a magnetic resonance imaging receive circuit according to a preferred embodiment of the present invention.

FIG. 4 shows an exemplary circuit in more detail. The circuit consists of three parts: a first part 100 which is typically contained within or forms part of a probe for insertion into the patient, a transmission line 200, and a second portion 300 which is positioned away from the first portion to avoid interfering with the signal.

The first portion 100 has an RF antenna (MI coil) which is coupled to a matching network consisting of series matching capacitors $C_{S1}$ and a parallel matching capacitor $C_{P1}$. The antenna is matched to an impedance of 100 Ω.

The matching circuitry is connected to decoupling circuitry 120, within which diodes $D_1$ short out the parallel matching capacitor when a positive DC bias is applied on the received input.

The transmission line 200 comprises two 50 Ω micro-coaxial cables 52,54.

The antenna, matching and decoupling (detuning) circuit and the micro-coaxial cables may be implemented as a single subsystem, delivering the received signal via two ports A, B, with a 180° phase shift.

The output from the cables feeds into a second portion 300 of the circuit which fulfils the functions of a two-way, 180° power splitter/combiner (i.e. functions to provide signal combination with common-mode rejection). The ports A and B feed into a conditioning section 320 which includes blocking capacitors 64,66 designed to block the negative DC bias present during the receive portion of the imaging cycle. Diodes 60,62 bypass these blocking capacitors to allow the positive bias during the transmit phase to pass. The current flow during the transmit phase is limited by resistors 56,58.

During the receive portion of the cycle, radio frequency signals pass via the capacitors 64,66 and are received by a matching section 310. Here, series matching inductors 68,70 and parallel matching capacitors 72,74 match the two micro-coaxial cables 52,54 to a half wavelength ($\lambda/2$) 50 Ω coaxial delay line 76. This delay line forms a balun 80 with output impedance of 200 Ω.

The signals pass down a further coaxial cable 82 and are received at ports X, Y. The signals are then converted into appropriate images at a receiver 18, as shown schematically in FIG. 1.

As previously mentioned, mode-selection is achieved by applying a DC potential difference between the ports: a positive bias is applied during the transmit portion of the cycle (to decouple the circuit), and a negative bias is applied during receive.

The circuit is manufactured entirely from non-ferromagnetic materials, to avoid interfering with the magnetic field. During transmit, the positive bias applied between points X and Y decouples the antenna 50 and prevents it oscillating. The way the circuit is designed ensures that, in that state, the same bias voltage is applied to both ends of the coil.

When in receive mode, the central cores of the micro-coaxial cables 52,54 swing positively and negatively anti-symmetrically around ground. Since the signals passing along those cables are always 180° out of phase, there is little if any disruption caused to the surrounding magnetic field. Conversely, this also means that the effects of external interference are substantially reduced. The use of such anti-symmetric (differential) signals allows a simple balun at the far end to be used to sum the out-of-phase responses.

Figure 3:
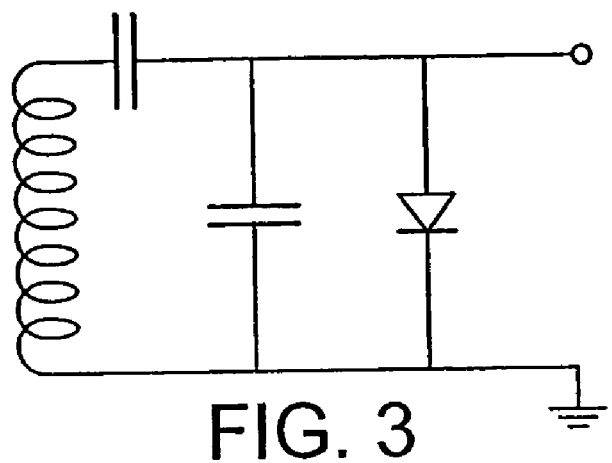
FIG. 3 shows an alternative method of decoupling the antenna.
Figure 6:
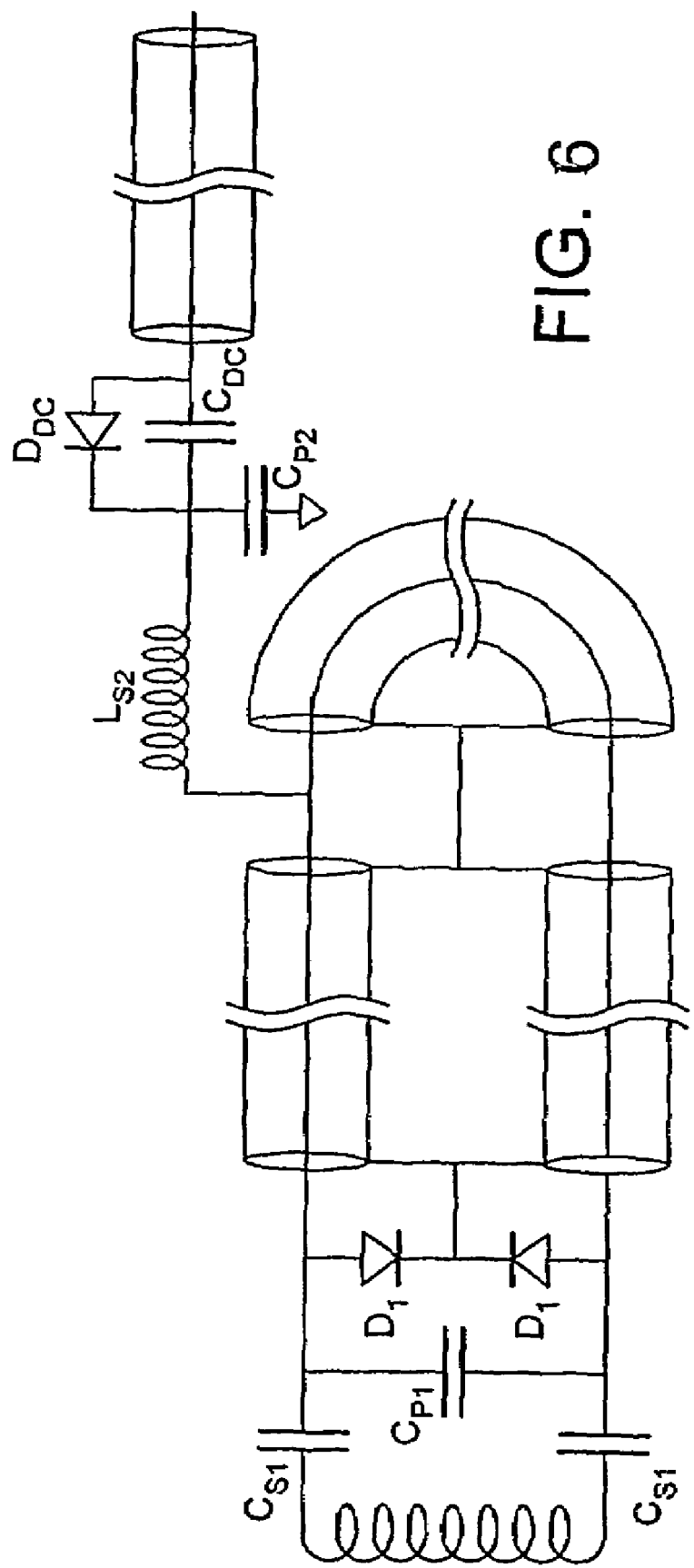
FIG. 6 shows a magnetic resonance imaging receive circuit according to another embodiment of the invention.

The arrangement shown in FIG. 3 may be used to replace the decoupling circuitry 120 shown in FIG. 4. FIG. 6 shows an alternative embodiment.

In some embodiments of the invention (not shown), the receive antenna 16 is not necessarily used in conjunction with an endoscope, and is not, in use, inserted into a body cavity. Instead, it may be placed adjacent to the body tissue or other material to be imaged.

The circuitry of the preferred embodiment may be manufactured as a series of distinct modules. For example, in FIG. 4, the first pare 100 may comprise one module, the transmission line 200 a second module, and the second portion 300 a third module. In use, the surgeon may select the appropriate modules for the surgical procedure to be undertaken. In particular, where there is a need to insert the antenna into a patient's body cavity, the surgeon selects an appropriate endoscope or catheter. He then selects an appropriate cable; where the circuit is fully matched at the antenna, the surgeon will have a choice of cable lengths. The cable is then plugged into appropriate circuitry for providing signal combination with common mode rejection, this circuitry itself being plugged into a suitable receiver. In some embodiments, the entire catheter or endoscope and/or the cables may be disposable, and may be designed for once-only use. The more expensive far-end circuitry, including the balun, is reuseable.

Finally, we turn to a detailed description of an exemplary implementation.

The loop antenna 50 (FIG. 4) was etched onto flexible copper clad (Crossley & Bradley Ltd, Krempel GMBH, KCL 2-35/50 FR). It was then fixed onto a cylindrical nylon former (13 mm diameter) using super glue and soldered to form the loops. The series capacitors $C_{S1}$, each 45 pF, were implemented as a parallel combinations of a 47 pF (RS, 298-9141), 33 pF (RS, 298-9135) and a 10 pF (RS, 243-386) capacitors. The parallel capacitor $C_{P1}$ was a parallel combination of two 100 pF (RS, 298-9157) capacitors, and a 47 pF (RS, 298-9141) capacitor. All capacitors used were ceramic surface mount. All, except the 10 pF capacitors, were 1206 format packages and had a rating of 100 V DC. The 10 pF capacitors were smaller 0402 formats and had 50 V DC rating. The diodes $D_1$ were low loss radio frequency switching PIN diodes (Infinion, BAR 65-02V). They had a reverse DC voltage rating of 30V and a forward current rating of 100 mA. The coil was covered using clear heat-shrink. The micro-coaxial cables 52,54 (Temp-Flex Cable Inc, 50 MCX-07-1) had an outer diameter of 1 mm and featured a silver only construction (no paramagnetic materials). The cables were terminated using SMB plugs (RS, 456-289).

The power combiner was implemented on strip board and housed in a 50 mm by 160 mm by 130 mm aluminium casing (Farnell, 930-246 and 930-349). Inputs from the micro-coaxial cable were SMB bulkheads (RS, 295-5693). Signal from the bulkheads was transferred to DC blocking/transmitting sub-circuit by a short length (less than 80 mm) of 100 Ohm twinaxial copper and tinned copper cable (Belden, 9815). The blocking capacitors $C_2$ 64, 66 were each comprised of 3 2200 pF ceramic surface mount capacitors with 100 V DC rating (RS, 298-9208). The same diodes as in the detuning circuit were used for the $D_2$ diodes 60, 62 (Infinion, BAR 65-02V). The current limiting resistors $R_2$ 56, 58 were each constructed using two 8.20 Ω resistors in parallel. Two 120 nH (Coil Craft, 1812SMS-R12J), one 100 nH (Coil Craft, 1812SMS-R10J) and one 33 nH (Coil Craft, 1812SMS-33J) air cored surface mount inductors 68, 70 were combined in series to produce the inductors $L_{S3}$. The parallel matching capacitors $C_{P3}$ 72, 74 were constructed from a 47 pF ceramic surface mount 100 V DC capacitor (RS, 298-9141) and a variable capacitor with range 8.5 to 40 pF and a 100 V DC rating (RS, 832-431). Right angle 50 Ohm Shielded BNC Socket (RS, 447-392) were used to connect to the half-wavelength delay line 76 and to the coaxial cable 82 leading to the receiver. Both these cables were constructed using RG223/IJ (RS, 227-564) coaxial cable with BNC plugs (RS, 193-4134) on either end. The 180 degree delay line was constructed by measuring an appropriate length of coaxial cable using the listed nominal velocity of propagation to produce a delay line with more than 180 degrees phase shift. This was then trimmed.

The invention claimed is:

1. A magnetic resonance imaging receive circuit, comprising:
   (a) a first portion including an rf antenna and decoupling circuitry adjacent to the antenna;
   (b) a spaced-apart second portion including mode control circuitry for causing the decoupling circuitry to switch the circuit between an rf receive mode in which the antenna is tuned for receipt of an rf signal, and a decoupled mode in which end terminals of the antenna are held at a substantially equal DC bias potential; and
   (c) balanced cables connecting the first and second portions, the cables transmitting a DC control to the decoupling circuitry when the circuit is in decoupled mode, and transmitting differential rf signals to the second portion when the circuit is in receive mode.

2. A circuit as claimed in claim 1 in which the first portion includes matching circuitry which provides substantially complete impedance matching between the antenna and the cables.

3. A circuit as claimed in claim 1 in which the second portion includes a balun for converting a differential mode signal on the cables to a common mode signal which is then passed to a balun output; and for rejecting any common mode signal on the cables.

4. A circuit as claimed in claim 3 in which the second portion includes balun matching circuitry providing substantially complete impedance matching between the balun and the cables.

5. A circuit as claimed in claim 4 in which the balun is arranged to convert a DC signal applied to the balun to equal DC biases on the balanced cables.

6. A circuit as claimed in claim 1 in which the antenna is matched when in rf receive mode by tuning circuitry within the first portion.

7. A circuit as claimed in claim 1 in which the antenna is matched when in rf receive mode by first tuning circuitry within the first portion and second tuning circuitry within the second portion.

8. A circuit as claimed in claim 1 including means for restricting the current flowing along the cables when in decoupled mode.

9. A circuit as claimed in claim 1 in which the cables comprise a pair of co-axial cables.

10. A magnetic resonance imaging device including a circuit as claimed in claim 1.

11. A magnetic resonance imaging device as claimed in claim 10 including an endoscope or catheter probe, the antenna being mounted to the probe.

12. A device as claimed in claim 11 in which the endoscope or catheter probe, and the said first portion, are designed for single-use.

* * * * *